(12) United States Patent
Park et al.

(10) Patent No.: US 11,689,218 B2
(45) Date of Patent: Jun. 27, 2023

(54) DECODING METHOD AND APPARATUS BASED ON POLAR CODE IN COMMUNICATION SYSTEM

(71) Applicant: ELECTRONICS AND TELECOMMUNICATIONS RESEARCH INSTITUTE, Daejeon (KR)

(72) Inventors: Gi Yoon Park, Daejeon (KR); Ok Sun Park, Daejeon (KR); Seok Ki Kim, Daejeon (KR); Eun Jeong Shin, Daejeon (KR); Gweon Do Jo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/675,010

(22) Filed: Feb. 18, 2022

(65) Prior Publication Data

US 2022/0271778 A1    Aug. 25, 2022

(30) Foreign Application Priority Data

Feb. 19, 2021  (KR) .................. 10-2021-0022858
Feb. 18, 2022  (KR) .................. 10-2022-0021609

(51) Int. Cl.
*H03M 13/11* (2006.01)
*H03M 13/29* (2006.01)
*H03M 13/13* (2006.01)

(52) U.S. Cl.
CPC .... *H03M 13/1128* (2013.01); *H03M 13/1111* (2013.01); *H03M 13/1191* (2013.01); *H03M 13/13* (2013.01); *H03M 13/2948* (2013.01)

(58) Field of Classification Search
CPC ................... H03M 13/1128; H03M 13/1111
See application file for complete search history.

(56) References Cited

U.S. PATENT DOCUMENTS 10,270,470 B2    4/2019  Li et al.
10,644,835 B1    5/2020  Abotabl et al.
(Continued)

OTHER PUBLICATIONS

Min-Oh Jeong and Song-Nam Hong; SC-Fano Decoding of Polar Codes; IEEE Access; pp. 81682-81690 Jun. 20, 2019 (Year: 2019).*
(Continued)

*Primary Examiner* — Joseph D Torres
(74) *Attorney, Agent, or Firm* — LRK Patent Law Firm

(57) ABSTRACT

An operation method of a receiving node may include performing a decoding operation for calculating first and second output transform values corresponding to first and second unit output nodes in each of a plurality of operation units constituting the polar decoder, based on first and second input transform values corresponding to first and second unit input nodes, and the decoding operation may include setting initial values of first and second variables for calculating the first output transform value; performing an iterative loop operation for updating the first and second variables; and calculating the first output transform value based on values of the first and second variables updated until a time when the iterative loop operation is terminated, wherein the iterative loop operation is terminated without performing iterations in which the first and second variables are determined not to be updated among a plurality of iterations.

11 Claims, 8 Drawing Sheets

(56) References Cited

U.S. PATENT DOCUMENTS

| | | | |
|---|---|---|---|
| 10,686,469 B2 | 6/2020 | Lou et al. | |
| 10,833,706 B2 | 11/2020 | Kim et al. | |
| 10,892,780 B2 | 1/2021 | Yu | |
| 2013/0117344 A1* | 5/2013 | Gross | G06F 17/16 |
| | | | 708/490 |
| 2018/0323810 A1* | 11/2018 | Sarkis | H03M 13/3961 |
| 2019/0082456 A1 | 3/2019 | Kim et al. | |
| 2020/0220652 A1 | 7/2020 | Son et al. | |
| 2020/0244425 A1 | 7/2020 | Wu et al. | |
| 2020/0412385 A1* | 12/2020 | Arikan | H03M 13/2906 |
| 2021/0036805 A1 | 2/2021 | Kim | |

OTHER PUBLICATIONS

Jinghu Chen et al., "Reduced-Complexity Decoding of LDPC Codes", IEEE Transactions on Communications, vol. 53, No. 8, Aug. 2005.

\* cited by examiner

FIG. 6

| | decoding algorithm |
|---|---|
| S601 | $\tilde{W}_2^{(opt)} \leftarrow \min_{d \in GF(Q)} \tilde{W}_2(d)$ |
| S602 | Find $(c_0, c_1, \cdots, c_{Q-1})$ such that $\tilde{W}_3(c_k) \leq \tilde{W}_3(c_m)$ for $0 \leq k < m < Q$. |
| S603 | For each $b_0 \in GF(Q)$ |
| S604 | $\beta \leftarrow \infty$ |
| S605 | $\gamma \leftarrow \infty$ |
| S606 | For each $k$ from 0 to $K_{max}$ |
| S607 | If $\beta \geq Z(b_0, c_k)$ |
| S608 | $\gamma \leftarrow \beta$ |
| S609 | $\beta \leftarrow Z(b_0, c_k)$ |
| S610 | End |
| S611 | If $\beta \leq \tilde{W}_2^{(opt)} + \tilde{W}_3(c_{k+1})$ |
| S612 | Break |
| S613 | End |
| S614 | End |
| S615 | $\tilde{W}_0(b_0) \leftarrow \beta - \log(1 + \exp(\beta - \gamma))$ |
| S616 | End |

DECODING METHOD AND APPARATUS BASED ON POLAR CODE IN COMMUNICATION SYSTEM

CROSS-REFERENCE TO RELATED APPLICATIONS

This application claims priority to Korean Patent Applications No. 10-2021-0022858 filed on Feb. 19, 2021 and No. 10-2022-0021609 filed on Feb. 18, 2022 with the Korean Intellectual Property Office (KIPO), the entire contents of which are hereby incorporated by reference.

BACKGROUND OF THE INVENTION

1. Field of the Invention

The present disclosure relates to a decoding technique in a communication system, and more particularly, to a technique for enhancing performance of polar code-based decoding operations.

2. Description of Related Art

With the development of information and communication technology, various wireless communication technologies are being developed. Representative wireless communication technologies include long term evolution (LTE) and new radio (NR) defined as the 3rd generation partnership project (3GPP) standards. The LTE may be one of 4th generation (4G) wireless communication technologies, and the NR may be one of 5th generation (5G) wireless communication technologies.

When a communication node transmits data to another communication node through a wireless channel in a communication system, an error may occur depending on a state of a wired/wireless channel. In particular, when communication signals are transmitted/received as being overcrowded on limited communication resources, an error occurrence probability may increase. Accordingly, in order for the communication node receiving the transmitted data to accurately detect the data, error correction codes having excellent error correction capability may be required. For example, a polar code, which is one of error correction codes, has been developed. The polar code may mean a code for correcting errors based on a channel polarization phenomenon in a physical channel through which data is transmitted.

According to the polar code scheme, a transmitting node may generate coded bits by encoding bits (e.g., information bits) based on a polar code. The transmitting node may generate modulated symbols by performing a modulation operation on the coded bits, and transmit the modulated symbols through radio resources. A receiving node may obtain demodulated symbols by performing a demodulation operation on a received signal. The receiving node may obtain information bits by performing decoding on the demodulated symbols (e.g., soft bits) based on the polar code. The decoding operation based on the polar code may be performed based on a successive cancellation (SC) scheme.

Recently, in order to transmit more information through limited radio resources, techniques for efficiently transmitting a plurality of bits through one symbol are being studied. In this case, an error correction code such as the polar code may also be configured to support transmission/reception of symbols composed of a plurality of bits instead of one bit. However, as the number of bits per symbol increases, there is a problem in that the complexity or amount of calculation in the decoding operation of the receiving node may increase.

Matters described as the prior arts are prepared to promote understanding of the background of the present disclosure, and may include matters that are not already known to those of ordinary skill in the technology domain to which exemplary embodiments of the present disclosure belong.

SUMMARY OF THE INVENTION

In order to solve the above-identified problems, exemplary embodiments of the present disclosure are directed to providing a decoding method and a decoding apparatus for enhancing efficiency of polar code-based decoding operations in a communication system.

According to an exemplary embodiment of the present disclosure for achieving the above-described objective, an operation method of a receiving node in a communication system may comprise: inputting a plurality of reception bits obtained by demodulating a reception signal received from a transmitting node to a plurality of input nodes of a polar decoder of the receiving node; performing a decoding operation for calculating first and second output transform values corresponding to first and second unit output nodes in each of a plurality of operation units constituting the polar decoder, based on first and second input transform values corresponding to first and second unit input nodes; and obtaining output bits at a plurality of output nodes of the polar decoder based on the decoding operation in each of the plurality of operation units, wherein the performing of the decoding operation comprises: setting initial values of first and second variables for calculating the first output transform value; performing an iterative loop operation including a plurality of iterations for updating the first and second variables; and calculating the first output transform value based on values of the first and second variables updated until a time when the iterative loop operation is terminated, wherein the iterative loop operation is terminated without performing iterations in which the first and second variables are determined not to be updated among the plurality of iterations.

The performing of the decoding operation may further comprise: calculating a minimum value that the first input transform value can have, based on information on a Galois field shared between the transmitting node and the receiving node before setting the initial values of the first and second variables; and sorting values that the second input transform value can have in the plurality of iterations in an ascending order.

The performing of the iterative loop operation may comprise: comparing a value of a first function defined based on the first and second input transform values with a value of the first variable in a k-th iteration among the plurality of iterations; updating the value of the second variable based on the value of the first variable when the value of the first variable is greater than or equal to the value of the first function; and updating the value of the first variable based on the value of the first function, wherein k has an integer value greater than or equal to 0 and less than or equal to a first setting value.

The performing of the iterative loop operation may comprise: comparing a value of a second function defined based on the first and second input transform values with a value of the first variable in a k-th iteration among the plurality of iterations; and terminating the iterative loop operation when the value of the first variable is less than or equal to the value of the second function, wherein k has an integer value greater than or equal to 0 and less than or equal to a first setting value.

The performing of the decoding operation may further comprise calculating the second output transform value based on a sum of the first and second input transform values.

The obtaining of the output bits may comprise performing a successive cancellation (SC) decoding operation in the polar decoder based on the decoding operation in each of the plurality of operation units, and the output bits include a result of restoring transmission bits to be transmitted from the transmitting node to the receiving node, and a result of restoring frozen bits used in a polar code encoding operation for the transmission bits in the transmitting node.

According to another exemplary embodiment of the present disclosure for achieving the above-described objective, a receiving node in a communication system may comprise a processor; a memory electronically communicating with the processor; and instructions stored in the memory, wherein when executed by the processor, the instructions cause the receiving node to: input a plurality of reception bits obtained by demodulating a reception signal received from a transmitting node to a plurality of input nodes of a polar decoder of the receiving node; perform a decoding operation for calculating first and second output transform values corresponding to first and second unit output nodes in each of a plurality of operation units constituting the polar decoder, based on first and second input transform values corresponding to first and second unit input nodes; and obtain output bits at a plurality of output nodes of the polar decoder based on the decoding operation in each of the plurality of operation units, wherein in the performing of the decoding operation, the instructions further cause the receiving node to: set initial values of first and second variables for calculating the first output transform value; perform an iterative loop operation including a plurality of iterations for updating the first and second variables; and calculate the first output transform value based on values of the first and second variables updated until a time when the iterative loop operation is terminated, wherein the iterative loop operation is terminated without performing iterations in which the first and second variables are determined not to be updated among the plurality of iterations.

In the performing of the decoding operation, the instructions further cause the receiving node to: calculate a minimum value that the first input transform value can have, based on information on a Galois field shared between the transmitting node and the receiving node before setting the initial values of the first and second variables; and sort values that the second input transform value can have in the plurality of iterations in an ascending order.

In the performing of the iterative loop operation, the instructions further cause the receiving node to: compare a value of a first function defined based on the first and second input transform values with a value of the first variable in a k-th iteration among the plurality of iterations; update the value of the second variable based on the value of the first variable when the value of the first variable is greater than or equal to the value of the first function; and update the value of the first variable based on the value of the first function, wherein k has an integer value greater than or equal to 0 and less than or equal to a first setting value.

In the performing of the iterative loop operation, the instructions further cause the receiving node to: compare a value of a second function defined based on the first and second input transform values with a value of the first variable in a k-th iteration among the plurality of iterations; and terminate the iterative loop operation when the value of the first variable is less than or equal to the value of the second function, wherein k has an integer value greater than or equal to 0 and less than or equal to a first setting value.

In the performing of the decoding operation, the instructions further cause the receiving node to calculate the second output transform value based on a sum of the first and second input transform values.

According to exemplary embodiments of a polar code-based decoding method and apparatus in a communication system, decoding operations based on the polar code scheme can be efficiently performed at a receiving node receiving signals encoded and transmitted by a transmitting node based on the polar code scheme. A polar decoder of the receiving node may operate to terminate an iterative loop decoding operation in a specific iteration, when it is determined that subsequent operations thereafter will not affect a final calculation result. As such, by early terminating or breaking the iterative loop decoding operation, the unnecessary amount of computations that do not affect the final calculation result can be skipped. Accordingly, the complexity or amount of calculations of the decoding operations can be reduced, and efficiency can be improved.

BRIEF DESCRIPTION OF DRAWINGS

FIG. 6 is a conceptual diagram for describing an exemplary embodiment of a decoding operation algorithm in a communication system.

DETAILED DESCRIPTION OF THE INVENTION

Figure 1:
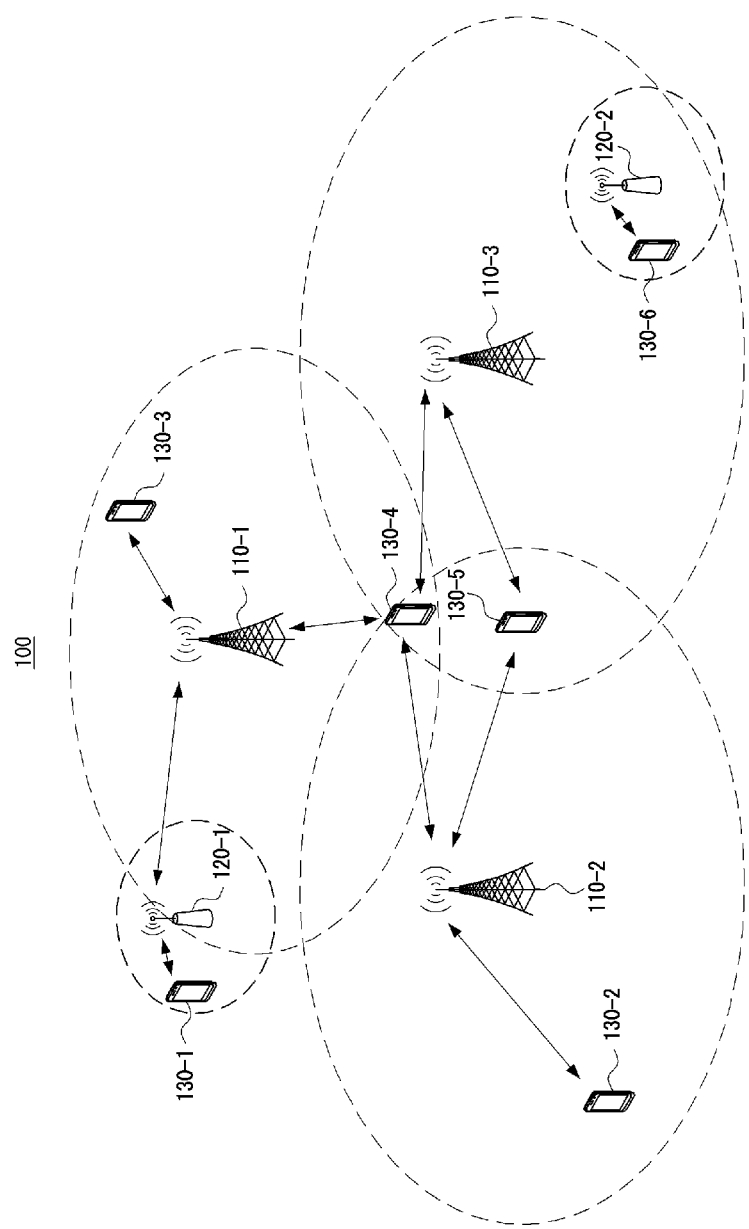
FIG. 1 is a conceptual diagram illustrating an exemplary embodiment of a communication system.

Embodiments of the present disclosure are disclosed herein. However, specific structural and functional details disclosed herein are merely representative for purposes of describing embodiments of the present disclosure. Thus, embodiments of the present disclosure may be embodied in many alternate forms and should not be construed as limited to embodiments of the present disclosure set forth herein.

Accordingly, while the present disclosure is capable of various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

In exemplary embodiments of the present disclosure, "at least one of A and B" may refer to "at least one of A or B" or "at least one of combinations of one or more of A and B". In addition, "one or more of A and B" may refer to "one or more of A or B" or "one or more of combinations of one or more of A and B".

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A communication system to which exemplary embodiments according to the present disclosure are applied will be described. The communication system to which the exemplary embodiments according to the present disclosure are applied is not limited to the contents described below, and the exemplary embodiments according to the present disclosure may be applied to various communication systems. Here, the communication system may have the same meaning as a communication network.

Throughout the present disclosure, a network may include, for example, a wireless Internet such as wireless fidelity (WiFi), mobile Internet such as a wireless broadband Internet (WiBro) or a world interoperability for microwave access (WiMax), 2G mobile communication network such as a global system for mobile communication (GSM) or a code division multiple access (CDMA), 3G mobile communication network such as a wideband code division multiple access (WCDMA) or a CDMA2000, 3.5G mobile communication network such as a high speed downlink packet access (HSDPA) or a high speed uplink packet access (HSDPA), 4G mobile communication network such as a long term evolution (LTE) network or an LTE-Advanced network, 5G mobile communication network, or the like.

Throughout the present disclosure, a terminal may refer to a mobile station, mobile terminal, subscriber station, portable subscriber station, user equipment, access terminal, or the like, and may include all or a part of functions of the terminal, mobile station, mobile terminal, subscriber station, mobile subscriber station, user equipment, access terminal, or the like.

Here, a desktop computer, laptop computer, tablet PC, wireless phone, mobile phone, smart phone, smart watch, smart glass, e-book reader, portable multimedia player (PMP), portable game console, navigation device, digital camera, digital multimedia broadcasting (DMB) player, digital audio recorder, digital audio player, digital picture recorder, digital picture player, digital video recorder, digital video player, or the like having communication capability may be used as the terminal.

Throughout the present specification, the base station may refer to an access point, radio access station, node B (NB), evolved node B (eNB), base transceiver station, mobile multihop relay (MMR)-BS, or the like, and may include all or part of functions of the base station, access point, radio access station, NB, eNB, base transceiver station, MMR-BS, or the like.

Hereinafter, preferred exemplary embodiments of the present disclosure will be described in more detail with reference to the accompanying drawings. In describing the present disclosure, in order to facilitate an overall understanding, the same reference numerals are used for the same elements in the drawings, and duplicate descriptions for the same elements are omitted.

FIG. 1 is a conceptual diagram illustrating a first exemplary embodiment of a communication system.

Referring to FIG. 1, a communication system 100 may comprise a plurality of communication nodes 110-1, 110-2, 110-3, 120-1, 120-2, 130-1, 130-2, 130-3, 130-4, 130-5, and 130-6. The plurality of communication nodes may support 4th generation (4G) communication (e.g., long term evolution (LTE), LTE-advanced (LTE-A)), 5th generation (5G) communication (e.g., new radio (NR)), or the like. The 4G communication may be performed in a frequency band of 6 gigahertz (GHz) or below, and the 5G communication may be performed in a frequency band of 6 GHz or above.

For example, for the 4G and 5G communications, the plurality of communication nodes may support a code division multiple access (CDMA) based communication protocol, a wideband CDMA (WCDMA) based communication protocol, a time division multiple access (TDMA) based communication protocol, a frequency division multiple access (FDMA) based communication protocol, an orthogonal frequency division multiplexing (OFDM) based communication protocol, a filtered OFDM based communication protocol, a cyclic prefix OFDM (CP-OFDM) based communication protocol, a discrete Fourier transform spread OFDM (DFT-s-OFDM) based communication protocol, an orthogonal frequency division multiple access (OFDMA) based communication protocol, a single carrier FDMA (SC-FDMA) based communication protocol, a non-orthogonal multiple access (NOMA) based communication protocol, a generalized frequency division multiplexing (GFDM) based communication protocol, a filter bank multi-carrier (FBMC) based communication protocol, a universal filtered multi-carrier (UFMC) based communication protocol, a space division multiple access (SDMA) based communication protocol, or the like.

In addition, the communication system 100 may further include a core network. When the communication system 100 supports the 4G communication, the core network may comprise a serving gateway (S-GW), a packet data network (PDN) gateway (P-GW), a mobility management entity (MME), and the like. When the communication system 100 supports the 5G communication, the core network may comprise a user plane function (UPF), a session management function (SMF), an access and mobility management function (AMF), and the like.

Meanwhile, each of the plurality of communication nodes 110-1, 110-2, 110-3, 120-1, 120-2, 130-1, 130-2, 130-3, 130-4, 130-5, and 130-6 constituting the communication system 100 may have the following structure.

Figure 2:
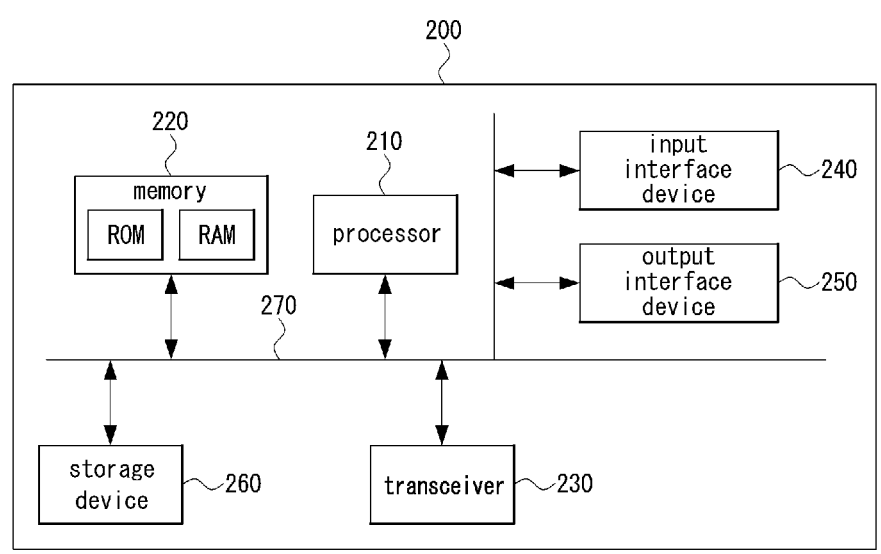
FIG. 2 is a block diagram illustrating an exemplary embodiment of a communication node constituting a communication system.

FIG. 2 is a block diagram illustrating a first embodiment of a communication node constituting a communication system.

Referring to FIG. 2, a communication node 200 may comprise at least one processor 210, a memory 220, and a transceiver 230 connected to the network for performing communications. Also, the communication node 200 may further comprise an input interface device 240, an output interface device 250, a storage device 260, and the like. Each component included in the communication node 200 may communicate with each other as connected through a bus 270.

However, each component included in the communication node 200 may be connected to the processor 210 via an individual interface or a separate bus, rather than the common bus 270. For example, the processor 210 may be connected to at least one of the memory 220, the transceiver 230, the input interface device 240, the output interface device 250, and the storage device 260 via a dedicated interface.

The processor 210 may execute a program stored in at least one of the memory 220 and the storage device 260. The processor 210 may refer to a central processing unit (CPU), a graphics processing unit (GPU), or a dedicated processor on which methods in accordance with embodiments of the present disclosure are performed. Each of the memory 220 and the storage device 260 may be constituted by at least one of a volatile storage medium and a non-volatile storage medium. For example, the memory 220 may comprise at least one of read-only memory (ROM) and random access memory (RAM).

Referring again to FIG. 1, the communication system 100 may comprise a plurality of base stations 110-1, 110-2, 110-3, 120-1, and 120-2, and a plurality of terminals 130-1, 130-2, 130-3, 130-4, 130-5, and 130-6. The communication system 100 including the base stations 110-1, 110-2, 110-3, 120-1, and 120-2 and the terminals 130-1, 130-2, 130-3, 130-4, 130-5, and 130-6 may be referred to as an 'access network'. Each of the first base station 110-1, the second base station 110-2, and the third base station 110-3 may form a macro cell, and each of the fourth base station 120-1 and the fifth base station 120-2 may form a small cell. The fourth base station 120-1, the third terminal 130-3, and the fourth terminal 130-4 may belong to cell coverage of the first base station 110-1. Also, the second terminal 130-2, the fourth terminal 130-4, and the fifth terminal 130-5 may belong to cell coverage of the second base station 110-2. Also, the fifth base station 120-2, the fourth terminal 130-4, the fifth terminal 130-5, and the sixth terminal 130-6 may belong to cell coverage of the third base station 110-3. Also, the first terminal 130-1 may belong to cell coverage of the fourth base station 120-1, and the sixth terminal 130-6 may belong to cell coverage of the fifth base station 120-2.

Here, each of the plurality of base stations 110-1, 110-2, 110-3, 120-1, and 120-2 may refer to a Node-B, a evolved Node-B (eNB), a base transceiver station (BTS), a radio base station, a radio transceiver, an access point, an access node, a road side unit (RSU), a radio remote head (RRH), a transmission point (TP), a transmission and reception point (TRP), an eNB, a gNB, or the like.

Here, each of the plurality of terminals 130-1, 130-2, 130-3, 130-4, 130-5, and 130-6 may refer to a user equipment (UE), a terminal, an access terminal, a mobile terminal, a station, a subscriber station, a mobile station, a portable subscriber station, a node, a device, an Internet of things (IoT) device, a mounted apparatus (e.g., a mounted module/device/terminal or an on-board device/terminal, etc.), or the like.

Meanwhile, each of the plurality of base stations 110-1, 110-2, 110-3, 120-1, and 120-2 may operate in the same frequency band or in different frequency bands. The plurality of base stations 110-1, 110-2, 110-3, 120-1, and 120-2 may be connected to each other via an ideal backhaul or a non-ideal backhaul, and exchange information with each other via the ideal or non-ideal backhaul. Also, each of the plurality of base stations 110-1, 110-2, 110-3, 120-1, and 120-2 may be connected to the core network through the ideal or non-ideal backhaul. Each of the plurality of base stations 110-1, 110-2, 110-3, 120-1, and 120-2 may transmit a signal received from the core network to the corresponding terminal 130-1, 130-2, 130-3, 130-4, 130-5, or 130-6, and transmit a signal received from the corresponding terminal 130-1, 130-2, 130-3, 130-4, 130-5, or 130-6 to the core network.

In addition, each of the plurality of base stations 110-1, 110-2, 110-3, 120-1, and 120-2 may support multi-input multi-output (MIMO) transmission (e.g., a single-user MIMO (SU-MIMO), multi-user MIMO (MU-MIMO), massive MIMO, or the like), coordinated multipoint (CoMP) transmission, carrier aggregation (CA) transmission, transmission in an unlicensed band, device-to-device (D2D) communications (or, proximity services (ProSe)), or the like. Here, each of the plurality of terminals 130-1, 130-2, 130-3, 130-4, 130-5, and 130-6 may perform operations corresponding to the operations of the plurality of base stations 110-1, 110-2, 110-3, 120-1, and 120-2, and operations supported by the plurality of base stations 110-1, 110-2, 110-3, 120-1, and 120-2. For example, the second base station 110-2 may transmit a signal to the fourth terminal 130-4 in the SU-MIMO manner, and the fourth terminal 130-4 may receive the signal from the second base station 110-2 in the SU-MIMO manner. Alternatively, the second base station 110-2 may transmit a signal to the fourth terminal 130-4 and fifth terminal 130-5 in the MU-MIMO manner, and the fourth terminal 130-4 and fifth terminal 130-5 may receive the signal from the second base station 110-2 in the MU-MIMO manner.

The first base station 110-1, the second base station 110-2, and the third base station 110-3 may transmit a signal to the fourth terminal 130-4 in the CoMP transmission manner, and the fourth terminal 130-4 may receive the signal from the first base station 110-1, the second base station 110-2, and the third base station 110-3 in the CoMP manner. Also, each of the plurality of base stations 110-1, 110-2, 110-3, 120-1, and 120-2 may exchange signals with the corresponding terminals 130-1, 130-2, 130-3, 130-4, 130-5, or 130-6 which belongs to its cell coverage in the CA manner. Each of the base stations 110-1, 110-2, and 110-3 may control D2D communications between the fourth terminal 130-4 and the fifth terminal 130-5, and thus the fourth terminal 130-4 and the fifth terminal 130-5 may perform the D2D communications under control of the second base station 110-2 and the third base station 110-3.

Hereinafter, decoding methods and apparatuses in a communication system will be described. Even when a method (e.g., transmission or reception of a data packet) performed at a first communication node among communication nodes is described, the corresponding second communication node may perform a method (e.g., reception or transmission of the data packet) corresponding to the method performed at the first communication node. That is, when an operation of a receiving node is described, a corresponding transmitting node may perform an operation corresponding to the operation of the receiving node. Conversely, when an operation of a transmitting node is described, a corresponding receiving node may perform an operation corresponding to the operation of the transmitting node.

Figure 3:
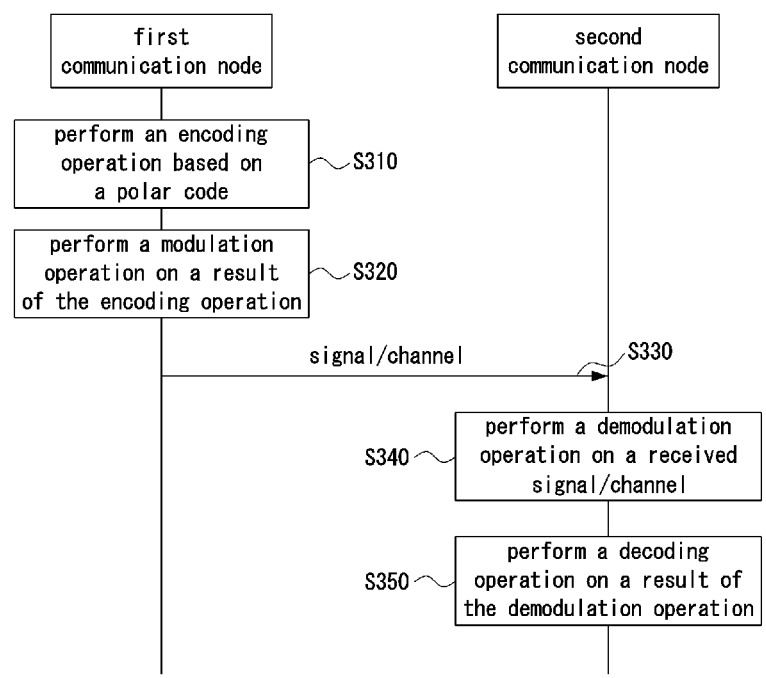
FIG. 3 is a sequence chart illustrating an exemplary embodiment of a method for transmitting and receiving signals in a communication system.

FIG. 3 is a sequence chart illustrating an exemplary embodiment of a method for transmitting and receiving signals in a communication system.

Referring to FIG. 3, a communication system may include a first communication node and a second communication node. The first communication node may transmit a signal/channel to the second communication node, and may be referred to as 'transmitting node'. The second communication node may receive the signal/channel from the first communication node, and may be referred to as 'receiving node'. When the first communication node is the base station shown in FIG. 1, the second communication node may be the terminal shown in FIG. 1. Alternatively, when the first communication node is the terminal shown in FIG. 1, the second communication node may be the base station or the terminal shown in FIG. 1. Each of the first communication node and the second communication node may be configured to be the same as or similar to the communication node 200 shown in FIG. 2.

The first communication node may generate coded bits by performing an encoding operation according to a polar code scheme on information bits corresponding to information to be transmitted (S310). The step S310 may be performed by a polar encoder included in the first communication node, and operations of the polar encoder may be controlled by a processor included in the first communication node (e.g., processor 210 shown in FIG. 2). In the encoding operation according to the polar code scheme, the coded bits may be generated based on the information bits and frozen bits having fixed values.

The first communication node may generate modulated symbols by performing a modulation operation on the coded bits or transmission symbols configured with the coded bits (S320). The step S320 may be performed by a modulator included in the first communication node, and operations of the modulator may be controlled by a processor included in the first communication node (e.g., processor 210 shown in FIG. 2). The first communication node may transmit the modulated symbols (e.g., signal and/or channel generated based on the modulated symbols) through radio resources (S330). The second communication node may receive the signal and/or channel from the first communication node.

Here, the signal may include a reference signal (e.g., channel state information-reference signal (CSI-RS), demodulation-reference signal (DM-RS), phase tracking-reference signal (PT-RS), etc.). The channel may be a physical downlink control channel (PDCCH), a physical downlink shared channel (PDSCH), a physical uplink control channel (PUCCH), a physical uplink shared channel (PUSCH), a physical broadcast channel (PBCH), or a sidelink channel.

The second communication node may obtain demodulated symbols by performing a demodulation operation on the received signal and/or channel (S340). The step S340 may be performed by a demodulator included in the second communication node, and operations of the demodulator may be controlled by a processor included in the second communication node (e.g., processor 210 shown in FIG. 2). Here, the demodulated symbols may be soft bits (e.g., log likelihood ratio (LLR) values). The second communication node may obtain information bits by performing a successive cancellation (SC) decoding operation on the soft bits (S350). The step S350 may be performed by a polar decoder included in the second communication node, and operations of the polar decoder may be controlled by a processor included in the second communication node (e.g., processor 210 shown in FIG. 2). The SC decoding operation will be described in more detail below with reference to FIG. 4.

Figure 4:
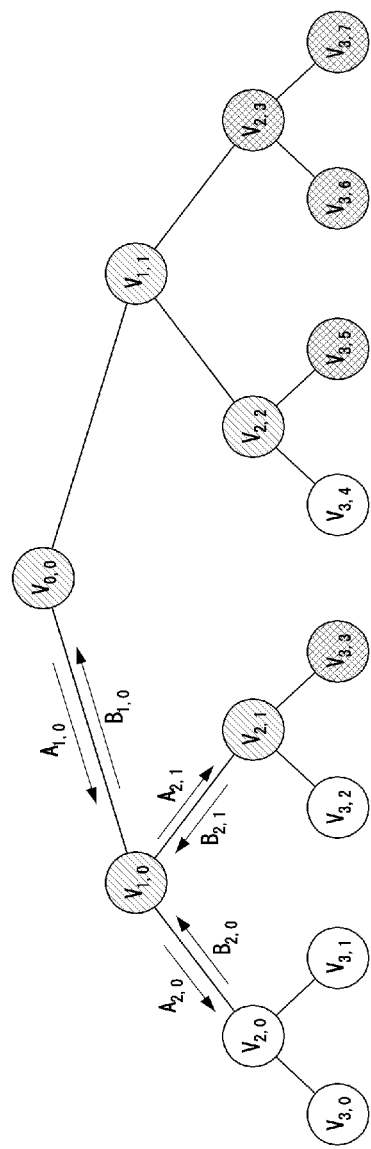
FIG. 4 is a conceptual diagram illustrating an exemplary embodiment of an SC decoding operation in a communication system.

FIG. 4 is a conceptual diagram illustrating an exemplary embodiment of an SC decoding operation in a communication system.

Referring to FIG. 4, a (N, K) polar code may be used in the communication system. Here, N may indicate the number of coded bits of the polar code (e.g., coded bits generated in the step S310 shown in FIG. 3), and K may indicate the number of information bits included in the polar code. The number of frozen bits included in the polar code may be (N-K). FIG. 4 shows an exemplary embodiment of a decoding tree used in the SC decoding scheme based on a (8, 4) polar code.

The decoding tree may be composed of a plurality of nodes. Each node may be expressed as $V_{i,j}$. Here, i may indicate a layer to which the node $V_{i,j}$ belongs, and j may be an index of the node $V_{i,j}$ belonging to each layer. Soft bits input to the node $V_{i,j}$ may be referred to as $A_{i,j}$. $A_{i,j}$ may be defined as in Equation 1 below.

$$A_{i,j} = [\alpha_0^{i,j}, \alpha_1^{i,j} \ldots, \alpha_{L_{i-1}}^{i,j},] \quad \text{[Equation 1]}$$

$A_{i,j}$ may be transmitted from a parent node (or upper node) located in an upper layer to a child node (or lower node) located in a lower layer. When $A_{i,j}$ is transmitted to nodes (e.g., $V_{3,j}$) belonging to the last layer of the decoding tree, the nodes (e.g., $V_{3,j}$) to which $A_{i,j}$ is inputted may generate a decoding result (e.g., hard decision result). The decoding result may be generated based on $A_{i,j}$ and may be referred to as $B_{i,j}$. $B_{i,j}$ may be defined as in Equation 2 below.

$$B_{i,j} = [\beta_0^{i,j}, \beta_1^{i,j}, \beta_{L_{i-1}}^{i,j},] \quad \text{[Equation 2]}$$

In FIG. 4, $B_{i,j}$ output from nodes $V_{i,j}$ denoted by circles without hatching may be regarded as being generated based on frozen bit(s), $B_{i,j}$ output from nodes $V_{i,j}$ denoted by circles with double hatching may be regarded as being generated based on information bit(s), and $B_{i,j}$ output from the node $V_{i,j}$ denoted by circles with hatching may include information bit(s) and frozen bit(s).

Specifically, the soft bits resulting from the step S340 shown in FIG. 3 may be input to a node $V_{0,0}$. The soft bits input to the node $V_{0,0}$ may be referred to as $A_{0,0}$, and the size of the soft bits input to the node $V_{0,0}$ may be 8 bits. $A_{1,0}$ and $A_{1,1}$ may be generated based on $A_{0,0}$ at the node $V_{0,0}$, $A_{1,0}$ may be transmitted to the node $V_{1,0}$, and $A_{1,1}$ may be transmitted to the node $V_{1,1}$. The size of each of $A_{1,0}$ and $A_{1,1}$ may be ½ of the size of $A_{0,0}$. For example, the size of each of $A_{1,0}$ and $A_{1,1}$ may be 4 bits. $A_{1,0}$ may be expressed as F(x,y), and $A_{1,1}$ may be expressed as G(x,y,u). F(x,y) and G(x,y,u) may be defined as in Equation 3 below.

$$\alpha_l^{i+1,2j} = F(\alpha_l^{i,j}, \alpha_{l+L_{i+1}}^{i,j})$$ [Equation 3]

$$\alpha_l^{i+1,2j+1} = G(\alpha_l^{i,j}, \alpha_{l+L_{i+1}}^{i,j}, \beta_l^{i+1,2j})$$

$$F(x, y) = 2\tanh^{-1}\left(\tanh\left(\frac{x}{2}\right)\tanh\left(\frac{y}{2}\right)\right) \approx S(x)S(y)\min(|x|, |y|)$$

$$G(x, y, u) = (-1)^u x + y$$

In Equation 3, the function S may correspond to a sign function (or signum function). For example, S(x) may have a value of 1 when x is positive, S(x) may have a value of −1 when x is negative, and S(x) may have a value of 0 when x is 0.

The above operations may be performed on all nodes $V_{i,j}$ belonging to the decoding tree. Here, the size of $A_{2,j}$ input to the nodes $V_{2,j}$ belonging to the third layer of the decoding tree may be 2 bits, and the size of $A_{3,j}$ input to the nodes $V_{3,j}$ belonging to the fourth layer of the decoding tree may be 1 bit.

Meanwhile, $B_{i,j}$ generated at the node $V_{i,j}$ may be transmitted to a parent node (or upper node). The decoding result transmitted from the node $V_{3,0}$ to the node $V_{2,0}$ may be referred to as $B_{3,0}$, and the decoding result transmitted from the node $V_{3,1}$ to the node $V_{2,0}$ may be referred to as $B_{3,1}$. The node $V_{3,0}$ may generate $B_{2,0}$ based on Equation 4 below, and may transmit the generated $B_{2,0}$ to $V_{1,0}$.

$$\beta_l^{i,j} = \beta_l^{i+1,2j} \oplus \beta_l^{i+1,2j+1} \beta_{l+L_{i+1}}^{i,j} = \beta_l^{i+1,2j+1}$$ [Equation 4]

The above operations may be performed in all nodes $V_{i,j}$ belonging to the decoding tree, and the decoding operation may be completed when $B_{0,0}$ is generated based on $B_{1,0}$ and $B_{1,1}$ at the node $V_{0,0}$.

Decoding in the polar code scheme performed based on the SC decoding operation may have excellent decoding performance, but there is a problem in that the complexity or amount of decoding operations may greatly increase as the number of bits per symbol increases. When the receiving node performs decoding according to the polar code scheme, a technique for reducing computational complexity or amount of computation may be required.

FIGS. 5A to 5D are conceptual diagrams for describing exemplary embodiments of a polar encoder and a polar decoder in a communication system.

In a polar encoder that performs encoding according to the polar code scheme, reliability (or bit capacity) of a communication channel may be polarized through polarization transform, and information or information bits to be transmitted may be transmitted through bit channels identified as having high reliability (or bit capacity) according to a result of the polarization transform. On the other hand, bit channels identified as having low reliability (or bit capacity) may be filled with predefined bits (e.g., frozen bits). The polarization transform in the polar encoder may be defined as a Kronecker power of a square matrix referred to as 'kernel'. For the signal encoded by the polar code scheme based on the polarization transform as described above, the process of sequentially decoding the information bits may be facilitated. Specifically, when a bit channel for transmitting information is appropriately selected to ensure a sufficiently large channel capacity, all information bits can be sequentially restored without error propagation. In the encoding operation according to the polar code scheme, due to its structural characteristics, the number of coded bits that can be generated may have a form of a power of a kernel size (i.e., $N = L^n$).

N input bits may be input to the polar encoder configured with N bit channels. The N input bits may include one or more information bits and one or more frozen bits. The input bits may be expressed as $u_i$(i=0, 1, . . . , N−1). The polar encoder to which N input bits are input may output N coded bits. The coded bits may be expressed as $x_i$(i=0, 1, . . . , N−1). The coded bits $x_i$ output from the polar encoder may constitute a transmission symbol.

Assuming that one transmission symbol consists of q bits, each symbol may correspond to an element of GF(Q) (Q=$2^q$). Here, GF(Q) may mean a finite field or Galois filed having a magnitude of Q. When a primitive element of GF(Q) is α, a transmission symbol composed of coded bits $x_i$ output from the polar encoder may be expressed as Equation 5.

$$\begin{bmatrix} x_0 \\ x_1 \\ \vdots \\ x_{N-1} \end{bmatrix} = \begin{bmatrix} 1 & \alpha \\ 0 & 1 \end{bmatrix}^{\otimes n} \begin{bmatrix} u_0 \\ u_1 \\ \vdots \\ u_{N-1} \end{bmatrix}$$ [Equation 5]

In Equation 5, '⊗n' may mean an n-th power of the Kronecker product.

When the transmission symbol composed of coded bits $x_i$ is modulated at the transmitting node and transmitted to the receiving node through a radio channel, the receiving node may obtain a demodulated symbol through a demodulation operation. Here, the demodulated symbol may be composed of soft bits. The soft bits may be expressed as $y_i$(i=0, 1, . . . , N−1). In the polar decoder of the receiving node, likelihood values as in Equation 6 may be calculated based on the soft bits $y_i$.

$$W(x_i) = Pr(y_i|x_i)$$ [Equation 6]

In Equation 6, $x_i$ may correspond to the coded bits transmitted through a radio channel, and $y_i$ may correspond to soft bits received through the radio channel. In other words, $x_i$ and $y_i$ may correspond to inputs and outputs of the radio channel, respectively. In the polar decoder of the receiving node, $W(u_i)$ may be obtained from the soft bits $y_i$ or $W(x_i)$ calculated based on the soft bits $y_i$, and $u_i$ corresponding to the input bits at the transmitting node may be restored. The receiving node may obtain information bits corresponding to the information to be transmitted from the transmitting node by excluding the frozen bits from the restored $u_i$.

Here, the input bits $u_i$ encoded by the polar encoder of the transmitting node and included in the transmission symbol may be elements of $A_i$ that is a subset of GF(Q), and information of $A_i$ may be shared in advance between the transmitting node and the receiving node. That is, the polar decoder of the receiving node may achieve a coding gain in restoring $u_i$ by excluding elements not included in $A_i$ (in other words, elements corresponding to the complement of $A_i$) from among the elements of GF(Q).

Figure 5A:
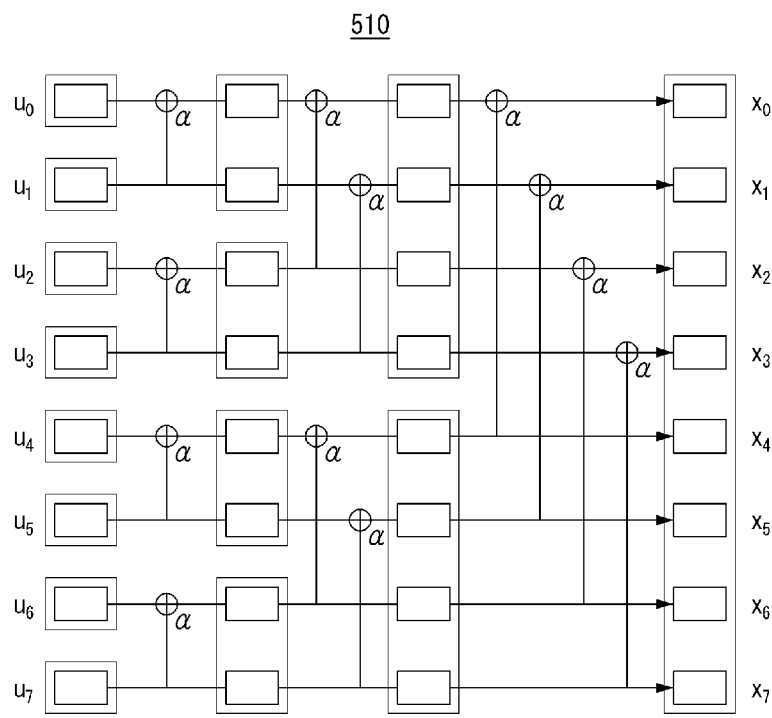
FIGS. 5A to 5D are conceptual diagrams for describing exemplary embodiments of a polar encoder and a polar decoder in a communication system.

Referring to FIG. 5A, an exemplary embodiment of the polar encoder 510 may have a structure in which N is 8. However, this is only an example for convenience of description, and exemplary embodiments of the polar encoder 510 are not limited thereto. The polar encoder 510 having a structure in which N is 8 may have 8 input nodes and 8 output nodes corresponding to 8 bit channels. A corresponding input bit $u_i$(i=0, 1, . . . , 7) may be input to each bit channel (or each input node). Each bit channel (or each output node) may output a coded bit $y_i$(i=0, 1, ..., 7) calculated based on the structure of the polar encoder 510. The polar encoder 510 may obtain 8 coded bits $x_i$ based on the 8 input bits $u_i$.

Here, the 8 input bits $u_i$ may include 4 information bits and 4 frozen bits. Among them, the information bits may be mapped to bit channels having relatively high reliability among the bit channels. On the other hand, the frozen bits may be mapped to bit channels having relatively low reliability among the bit channels. In the polar encoder 510, an encoding operation may be performed based on α, which is a primitive element of GF(Q).

Figure 5B:
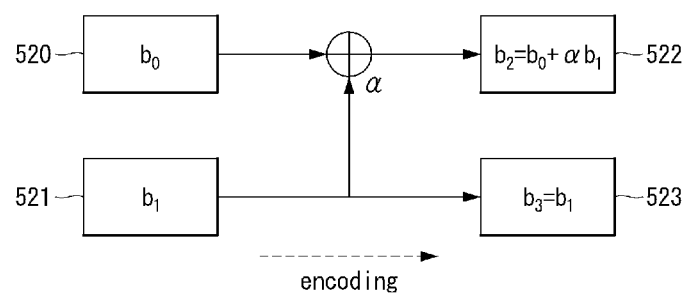

The structure of the polar encoder 510 shown in FIG. 5A may be composed of operation units as shown in FIG. 5B. In other words, nodes 520, 521, 522, and 523 shown in FIG. 5B may correspond to some of the nodes constituting the polar encoder 510 shown in FIG. 5A. The structure expressed as shown in FIG. 5B may be referred to as a 'butterfly architecture'.

In the butterfly architecture shown in FIG. 5B, two input values $b_0$ and $b_1$ may be input through two input nodes 520 and 521, and two output values $b_2$ and $b_3$ may be output two output nodes 522 and 523. When the first and second input values $b_0$ and $b_1$ are input through the first and second input nodes 520 and 521, first and second output values $b_2$ and $b_3$ determined through the operations according to the structure shown in FIG. 5B to the first and second output nodes 522 and 523. Here, the first output value $b_2$ and the second output value $b_3$ may be determined as in Equations 7 and 8, respectively.

$$b_2 = b_0 + \alpha b_1 \quad \text{[Equation 7]}$$

$$b_3 = b_1 \quad \text{[Equation 8]}$$

The nodes constituting the polar encoder 510 shown in FIG. 5A may correspond to the first input node 520, the second input node 521, the first output node 522, and/or the second output node 523 constituting the operation unit shown in FIG. 5B. For example, each of the input nodes constituting the polar encoder 510 shown in FIG. 5A may correspond to either the first input node 520 or the second input node 521 in the operation unit sown in FIG. 5B. Each of the output nodes constituting the polar encoder 510 shown in FIG. 5A may correspond to either the first output node 522 or the second output node 523 in the operation unit shown in FIG. 5B. The remaining nodes excluding the input nodes and the output nodes among the nodes constituting the polar encoder 510 shown in FIG. 5A may correspond to either the first input node 520 or the first input node 520 of the operation unit shown in FIG. 5B, or correspond to either the first output node 522 or the second output node 523, according to the encoding operation process.

Figure 5C:
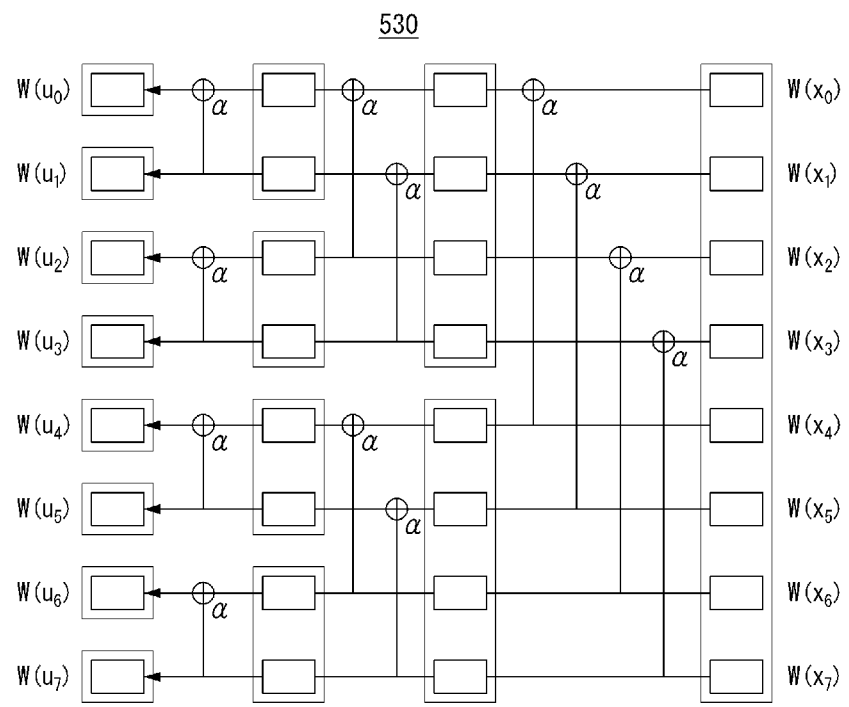

Referring to FIG. 5C, an exemplary embodiment of the polar decoder 530 may have a structure in which N is 8. However, this is only an example for convenience of description, and exemplary embodiments of the polar decoder 530 are not limited thereto. The polar decoder 530 having a structure in which N is 8 may have 8 input nodes and 8 output nodes corresponding to 8 bit channels. $W(x_i)$ (i=0, 1, ..., 7) calculated based on the corresponding soft bit $y_i$(i=0, 1, ..., 7) may be input to each bit channel (or each input node). Each bit channel (or each output node) may output $W(u_i)$(i=0, 1, ..., 7) calculated based on the structure of the polar decoder 530. The polar decoder 530 may obtain 8 $W(u_i)$ values based on the 8 $W(x_i)$ values. Through this, the polar decoder 530 may restore $u_i$(i=0, 1, ..., 7) corresponding to the input bits in the transmitting node. Among the restored 8 $u_1$ values, 4 bits excluding 4 frozen bits may be information bits corresponding to the information to be transmitted by the transmitting node.

Figure 5D:
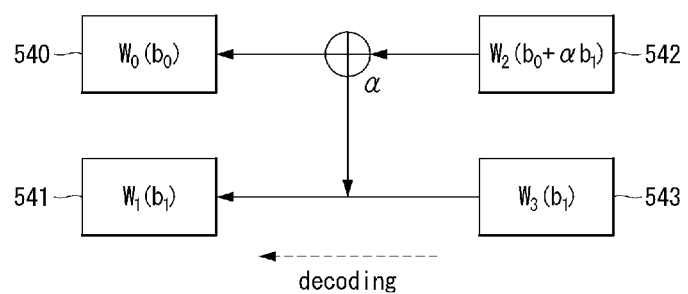

The structure of the polar decoder 530 shown in FIG. 5C may include operation units as shown in FIG. 5D. In other words, nodes 540, 541, 542, and 543 shown in FIG. 5D may correspond to some of the nodes constituting the polar decoder 530 shown in FIG. 5C. The structure expressed as shown in FIG. 5D may be referred to as a 'butterfly architecture'.

In the butterfly architecture shown in FIG. 5D, two input values $W_2$ and $W_3$ may be input through two input nodes 542 and 543, and two output values $W_0$ and $W_1$ may be output through two output nodes 540 and 541. When the first and second input values $W_2$ and $W_3$ are input through the first and second input nodes 542 and 543, the first and second output values $W_0$ and $W_1$ determined through operations according to the structure shown in FIG. 5D through the first and second output nodes 540 and 541.

The operations in the polar decoder 530 may correspond to the reverse process of the operations in the polar encoder 510. The operation unit of the polar decoder 530 shown in FIG. 5D may correspond to the operation unit of the polar encoder 510 shown in FIG. 5B. The first output value $W_0$ in FIG. 5D may correspond to a likelihood value (i.e., $W_0(b_0)$) of the first input value $b_0$ in FIG. 5B. The second output value $W_1$ in FIG. 5D may correspond to a likelihood value (i.e., $W_1(b_1)$) of the second input value $b_1$ in FIG. 5B. The first input value $W_2$ in FIG. 5D may correspond to a likelihood value (i.e., $W_2(b_2)=W_2(b_0+\alpha b_1)$) of the first output value $b_2$ in FIG. 5B. The second input value $W_3$ in FIG. 5D may correspond to a likelihood value (i.e., $W_3(b_3)=W_3(b_1)$) of the second output value $b_3$ in FIG. 5B. Here, the first output value $W_0$ and the second output value $W_1$ may be determined as in Equations 9 and 10.

$$W_0(b_0) = \frac{1}{Q} \sum_{b_1 \in GF(Q)} W_2(b_0 + \alpha b_1) W_3(b_1) \quad \text{[Equation 9]}$$

$$W_1(b_1) = \frac{1}{Q} W_2(b_0 + \alpha b_1) W_3(b_1) \quad \text{[Equation 10]}$$

The nodes constituting the polar decoder 530 shown in FIG. 5C may correspond to the first input node 542, the second input node 543, the first output node 540, and/or the second output node 541 constituting the operation unit shown in FIG. 5D. For example, each of the input nodes constituting the polar decoder 530 shown in FIG. 5C may correspond to either the first input node 542 or the second input node 543 in the operation unit shown in FIG. 5D. Each of the output nodes constituting the polar decoder 530 shown in FIG. 5C may correspond to either the first output node 540 or the second output node 541 in the operation unit shown in FIG. 5D. The remaining nodes excluding the input nodes and output nodes are among the nodes constituting the polar decoder 530 shown in FIG. 5C may correspond to either the first input node 542 or the first input node 542 of the operation units shown in FIG. 5D, or may correspond to either the first output node 540 or the second output node 541 according to the encoding operation process.

Values output from the bit channels (or output nodes) of the polar decoder 530 shown in FIG. 5C may be expressed as $W(u_i)$(i=0, 1, ..., 7). Here, among the eight $W(u_1)$ values, values output through the output nodes 530, 532, 534, and 536 corresponding to the first output node 540 in the operation unit shown in FIG. 5D may be expressed as $W_0(u_{2m})$ (m=0,1,2,3). On the other hand, among the eight $W(u_i)$ values, values output through the output nodes 531, 533, 535, and 537 corresponding to the second output node 541 in the operation unit shown in FIG. 5D may be expressed as $W_1(u_{2m+1})$ (m=0,1,2,3). In other words, i may be expressed as 'i=2m+k' (m=0, 1, 2, 3. k=0, 1), and $W(u_i)$ may be expressed as $W_k(u_{2m+k})$.

Based on the 8 $W(u_i)$ values, 8 $\hat{u}_i$ values may be calculated. Here, the 8 $\hat{u}_i$ values may correspond to a result of the decoding operation of the polar decoder 530. In other words, the 8 $\hat{u}_i$ values may be estimated as a result of restoration of the 8 $u_i$ values input to the polar encoder 510 in the transmitting node. The eight $\hat{u}_i$ values may be calculated as in Equation 11.

$$\hat{u}_i = \hat{u}_{2m+k} = \arg\max_{u_{2m+k} \in A_{2m+k}} W_k(u_{2m+k}), \quad \text{[Equation 11]}$$

$$0 \le m < \frac{N}{2}, 0 \le k < 2$$

Equation 11 may mean that one element among the elements of the set $A_i = A_{2m+k}$ shared in advance between the transmitting node and the receiving node, that that maximizes the value of $W(u_i) = W_k(u_{2m+k})$, is defined as $\hat{u}_{2m+k}$. In other words, an element that maximizes the value of $W(u_i)$ output from the polar decoder 530 among the elements of the set $A_i$ shared in advance between the transmitting node and the receiving node may be estimated as the result of restoration of $u_i$.

When a value of W corresponding to an arbitrary node is W(•), W(•) may have a value between 0 and 1. Therefore, a value obtained by taking −log of W(•) (i.e., − log (W(•))) may have a value of 0 or more and may be numerically stabilized. As described above, by taking −log of W(•), it is possible to reduce sensitivity to a quantization error in the decoding operation process. $\tilde{W}_k(\cdot)$ corresponding to a converted value of W(•) for an arbitrary node may be calculated as in Equation 12.

$$\tilde{W}_k(\cdot) = -\log\left(\frac{1}{Q}W_k(\cdot)\right), 0 \le k < 4 \quad \text{[Equation 12]}$$

Equations 9 and 10 may be rewritten as Equations 13 and 14 based on Equation 12.

$$\tilde{W}_0(b_0) = \quad \text{[Equation 13]}$$
$$-\log\left(\sum_{b_1 \in GF(Q)} \left(\frac{1}{Q}W_2(b_0 + \alpha b_1)\right)\left(\frac{1}{Q}W_3(b_1)\right)\right)$$

$$\tilde{W}_1(b_1) = -\log\left(\frac{1}{Q^2}W_2(b_0 + \alpha b_1)W_3(b_1)\right) \quad \text{[Equation 14]}$$
$$= \tilde{W}_2(b_0 + \alpha b_1) + \tilde{W}_3(b_1)$$

Here, Equation 13 may be approximated as Equation 15.

$$\tilde{W}_0(b_0) \approx \quad \text{[Equation 15]}$$
$$Z(b_0, b_1^{(opt)}) - \log\left(\sum_{b_0 \in GF(Q)} \exp(Z(b_0, b_1^{(opt)}) - Z(b_0, b_1))\right)$$

-continued
$$Z(b_0, b_1) = \tilde{W}_2(b_0 + \alpha b_1) + \tilde{W}_3(b_1)$$

$$b_1^{(opt)} = \arg\min_{b_1 \in GF(Q)} Z(b_0, b_1)$$

In Equation 15, the term $Z(b_0, b_1^{(opt)})$ may express the most dominant component in $\tilde{W}_0(b_0)$, which is a transform value of $W_0(b_0)$ expressed as in Equation 13. Meanwhile, in Equation 15, the term $-\log (\Sigma_{b_1 \in GF(Q)} \exp (Z(b_0, b_1^{(opt)}) - Z(b_0, b_1)))$ may be an approximate expression of a result of subtracting the term $Z(b_0, b_1^{(opt)})$ from $\tilde{W}_0(b_0)$. $b_1^{(opt)}$ constituting the term $Z(b_0, b_1^{(opt)})$ may be determined to be one element $b_1$ that minimizes a value of a function $Z(b_0, b_1)$ among the elements of the Galois field GF(Q).

The polar decoder 530 having the structure shown in FIG. 5C may perform decoding based on operations in each of the operation units shown in FIG. 5D. In each of the operation units shown in FIG. 5D, based on Equations 14 and 15, operations for calculating a first output transform value $\tilde{W}_0$ and a second output transform value $\tilde{W}_1$ from a first input transform value $\tilde{W}_2$ and a second input transform value $\tilde{W}_3$ may be performed. Here, the operation of Equation 14 has a relatively low complexity, but the operation of Equation 15 may have a fairly high complexity or a large amount of computations even though it is approximated once. In Equation 15, in a process of performing a summing operation $(\Sigma_{b_0 \in GF(Q)} \exp (Z(b_0, b_1^{(opt)}) - Z(b_0, b_1)))$ for all $b_0 \in GF(Q)$, an iterative operation $$\left(\text{i.e., } \arg\min_{b_1 \in GF(Q)} Z(b_0, b_1)\right)$$

for identifying $b_1$ that minimizes a value of $Z(b_0, b_1)$ for each $b_0$ among all elements of GF(Q) may be performed. That is, the operation of Equation 15 may have a complexity proportional to a square of the magnitude of GF(Q) (in other words, square of Q). Therefore, for efficient decoding operations in the polar decoder 530, a decoding algorithm for simplifying the operation of Equation 15 may be required.

FIG. 6 is a conceptual diagram for describing an exemplary embodiment of a decoding operation algorithm in a communication system.

Referring to FIG. 6, a receiving node in a communication system may obtain soft symbols by receiving and demodulating a signal transmitted as being encoded by a polar encoder, and may restore information bits by performing a decoding operation on the obtained soft symbols based by using a polar decoder. Here, the polar decoder may be the same as or similar to the polar decoder 530 described with reference to FIG. 5C. The polar decoder may perform decoding based on an operation in each of the operation units that are the same as or similar to the operation unit described with reference to FIG. 5D.

In each operation unit described with reference to FIG. 5D, based on the first and second input values $W_2$ and $W_3$ input to the first and second input nodes 542 and 543 of the butterfly architecture, the first and second output values $W_0$ and $W_1$ output through the first and second output nodes 540 and 541 of the butterfly architecture may be obtained. As described with reference to Equations 12 to 15, the operation in each operation unit described with reference to FIG. 5D may be expressed as an operation for calculating the first and second transform values $\tilde{W}_0$ and $\tilde{W}_1$ from the first and second input transform values $\tilde{W}_2$ and $\tilde{W}_3$ corresponding to the first and second input nodes 542 and 543 of the butterfly architecture.

In each operation unit described with reference to FIG. 5D, the polar decoder may perform the same or similar operations as those shown in Equations 14 and 15. Here, the operation of Equation 15 may correspond to a decoding operation for obtaining the second output transform value $\tilde{W}_1$ from the first and second input transform values $\tilde{W}_2$ and $\tilde{W}_3$. The polar decoder may perform the operation of Equation 15 based on the same or similar decoding operation algorithm as shown in FIG. 6.

In the decoding operation algorithm shown in FIG. 6, the polar decoder may define the smallest value among $\tilde{W}_2(d)$ values for all $d \in GF(Q)$ as a first lower limit value $\tilde{W}_2^{(opt)}$ (S601). In other words, the first lower limit value $\tilde{W}_2^{(opt)}$ may correspond to the lower limit value or the minimum value of the first input transform value $\tilde{W}_2$. Then, the polar decoder may sort the values of $\tilde{W}_3(c_m)$ for all m equal to or greater than 0 and smaller than Q based on the sizes thereof (S602). For example, the polar decoder may sort the values of $\tilde{W}_3(c_m)$ in ascending order for all m equal to or greater than 0 and less than Q. In other words, the polar decoder may determine $(c_0, c_1, \ldots, c_{Q-1})$ so that $\tilde{W}_3(c_j) \leq \tilde{W}_3(c_m)$ is established for arbitrary m and j satisfying $0 \leq j < m < Q$.

Thereafter, the polar decoder may perform an iterative loop operation such as the following steps S604 to S616 for all $b_0 \in GF(Q)$ (S603). In other words, the polar decoder may repeatedly perform operations as in the steps S604 to S616 for each of all $b_0 \in GF(Q)$.

As an initial condition of the iterative loop operation, the polar decoder may define a value of a first variable $\beta$ as a first initial value (S604) and a value of a second variable $\gamma$ as a second initial value (S605). Here, the first initial value and the second initial value may be set to a value greater than the maximum value that the Z function defined in Equation 15 can have. The first initial value and the second initial value may be set as maximum values configurable in the system. The first initial value and the second initial value may be set to the same value or set to different values.

Then, the polar decoder may perform the iterative loop operation, such as the following steps S606 to S614, for all k equal to or greater than 0 and less than or equal to $K_{max}$ (S606). Here, $K_{max}$ may correspond to a parameter related to the maximum number of iterative loop operations. $K_{max}$ may have any value greater than or equal to 0 and less than Q. As the value of $K_{max}$ increases, the complexity of the iterative loop operation of the steps S606 to S614 may increase.

In the steps S607 to S610, the polar decoder may set the values of the first variable $\beta$ and the second variable $\gamma$ based on k for each iteration during the iterative loop operation. Specifically, the polar decoder may calculate a value of a first function $Z(b_0, c_k)$ in the k-th iteration. The polar decoder may compare the calculated value of the first function $Z(b_0, c_k)$ with the value of the first variable $\beta$ (S607). If the value of the first variable $\beta$ in the k-th iteration is equal to or greater than the value of the first function $Z(b_0, c_k)$ (S607), the polar decoder may substitute the value of the first variable $\beta$ into the second variable $\gamma$ (S608), and the value of the first function $Z(b_0, c_k)$ into the first variable $\beta$ (S609). In other words, if the value of the first variable $\beta$ is equal to or greater than the value of the first function $Z(b_0, c_k)$ (S607), the polar decoder may set the value of the second variable $\gamma$ to the value of the first variable $\beta$ at the corresponding time point (S608), and set the value of the first variable $\beta$ may be set to the value of the first function $Z(b_0, c_k)$ at the time (S609). On the other hand, if the value of the first variable $\beta$ is smaller than the value of the first function $Z(b_0, c_k)$ in the k-th iteration (S607), the polar decoder may not change the value of the first variable $\beta$ and the value of the second variable $\gamma$ (S610).

The polar decoder may determine whether to break the iterative loop operation of the steps S606 to S614 based on k in the steps S611 to S613 in the k-th iteration. Specifically, in the k-th iteration, a value of a second function $Y(k)$ defined as in Equation 16 may be compared with the value of the first variable $\beta$ (S611).

$$Y(k) = \tilde{W}_2^{(opt)} + \tilde{W}_3(c_{k+1}) \qquad \text{[Equation 16]}$$

The second function $Y(k)$ defined as in Equation 16 may compare a sum (i.e., $\tilde{W}_2^{(opt)} + \tilde{W}_3(c_{k+1})$) of the first lower limit value $\tilde{W}_2^{(opt)}$ and the second input transform value $\tilde{W}_3(c_{k+1})$ for $c_{k+1}$ with the value of the first variable $\beta$ (S611). If the value of the first variable $\beta$ in the k-th iteration is less than or equal to the value of the second function $Y(k)$ (i.e., $\beta \leq \tilde{W}_2^{(opt)} + \tilde{W}_3(c_{k+1})$) (S611), the polar decoder may break the iterative loop operation of the steps S606 to S614 (S612), and may perform an operation according to the step S615.

On the other hand, when the value of the first variable $\beta$ is greater than the value of the second function $Y(k)$ in the k-th iteration (i.e., $\beta > \tilde{W}_2^{(opt)} + \tilde{W}_3(c_{k+1})$) (S611), the polar decoder may re-perform the operation according to the steps S607 to S614 for the (k+1)-th iteration without breaking the iterative loop operation of the steps S606 to S614 (S613) (S606). If k is $K_{max}$, the polar decoder may terminate the iterative loop operation of the steps S606 to S614 in the step S613 and perform the operation according to the step S615.

In the step S615, the polar decoder may calculate the first output transform value $\tilde{W}_0(b_0)$ based on the value of the first variable $\beta$ and the value of the second variable $\gamma$ determined according to the iterative loop operation of the steps S606 to S614 as shown in Equation 17.

$$\tilde{W}_0(b_0) = \beta - \log(1 + \exp(\beta - \gamma)) \qquad \text{[Equation 17]}$$

After performing the operations of the steps S604 to S615 for all $b_0 \in GF(Q)$, the polar decoder may terminate the iterative loop operation (S616). The value of the first output transform value $\tilde{W}_0(b_0)$ calculated until a time when the operations according to the steps S601 to S616 are terminated may be a result of the decoding operation algorithm shown in FIG. 6. In other words, the value of the first output transform value $\tilde{W}_0(b_0)$ determined based on the steps S601 to S616 in the decoding operation algorithm shown in FIG. 6 may correspond to an approximate calculation result for the first output transform value $\tilde{W}_0(b_0)$ shown in Equation 15.

Referring to the first lower limit value $\tilde{W}_2^{(opt)}$ determined in the step S601 and the second input transform value $\tilde{W}_3$ (i.e., $\tilde{W}_3(c_k) < \tilde{W}_3(c_{k+1})$) sorted according to c values in ascending order in the step S602, if the value of the first variable $\beta$ is less than or equal to the value of the second function $Y(k)$ in the step S611 of the k-th iteration (i.e., $\beta \leq \tilde{W}_2^{(opt)} + \tilde{W}_3(c_{k+1})$), it may be determined that the value of the first variable $\beta$ is not to be updated in subsequent iterations. Specifically, if the value of the first variable $\beta$ is less than or equal to the value of the second function $Y(k)$ in the step S611 of the k-th iteration (i.e., $\beta \leq \tilde{W}_2^{(opt)} + \tilde{W}_3(c_{k+1})$), it may be predicted that the value of the first variable $\beta$ is less than the value of the first function $(Z(b_0, c_{k+1}) = \tilde{W}_2(b_0 + \alpha c_{k+1}) + \tilde{W}_3(c_{k+1}))$ in the step S607 of the (k+1)-th iteration. If the value of the first variable $\beta$ is smaller than the value of the first function $Z(b_0, c_{k+1})$ in the step S607, the value of the first variable $\beta$ and the value of the second variable γ may not to be updated (S610). Similarly, the value of the first variable β and the value of the second variable γ may not to be updated because the value of the first variable β is smaller than the value of the first function also in the step S611 of the (k+2)-th iteration and subsequent iterations (S610). In other words, when the value of the first variable β is less than or equal to the value of the second function Y(k) in the step S611 of the k-th iteration (i.e., $\beta \leq \tilde{W}_2^{(opt)} + \tilde{W}_3(c_{k+1})$), Equation 18 may be established for arbitrary m satisfying $k < m \leq K_{max}$.

$$\beta < \tilde{W}_2(b_0 + \alpha c_m) + \tilde{W}_3(c_m), k < m \leq K_{max} \quad \text{[Equation 17]}$$

That is, if the value of the first variable β is less than or equal to the value of the second function Y(k) in the step S611 of the k-th iteration, the value of the first variable β and the value of the second variable γ may not be updated in the (k+1)-th iteration and subsequent iterations. In other words, if the value of the first variable β is less than or equal to the value of the second function Y(k) in the step S611 of the k-th iteration, even though operations according to the subsequent iterations are performed, the result of the decoding operation (i.e., the calculation result of the first output transform value $\tilde{W}_0(b_0)$ according to the step S615 and Equation 17) may not be affected. According to the operation of breaking the iterative loop operation (S612) based on the determination result of the step S611, the polar decoder may not perform operations after a specific iteration that will not affect the decoding operation result. Accordingly, the polar decoder may omit or skip an unnecessary amount of calculations that do not affect the final calculation result, and the efficiency of the decoding operation of the polar decoder can be improved.

Figure 7:
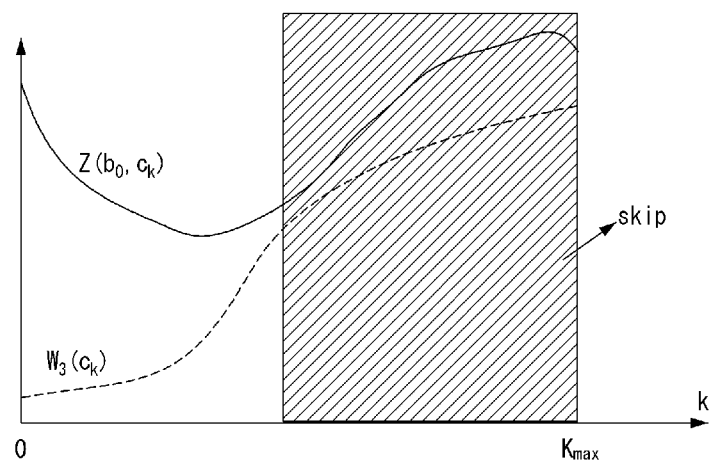
FIG. 7 is a graph for describing an exemplary embodiment of a decoding operation algorithm in a communication system.

FIG. 7 is a graph for describing an exemplary embodiment of a decoding operation algorithm in a communication system.

Referring to FIG. 7, the polar decoder may perform operations based on the decoding operation algorithm described with reference to FIG. 6. In an exemplary embodiment of the decoding operation algorithm, the iterative loop operation according to an increase in k may be performed. In the iterative loop operation according to the increase of k, the value of the first function $Z(b_0, c_k)$ and the value of the second input transform value $\tilde{W}_3(c_k)$ may change as shown in the graph of FIG. 7. As described with reference to the step S611 of FIG. 6, in an exemplary embodiment of the decoding operation algorithm, iterative loop operations in iterations (e.g., hatched area in FIG. 7) after a specific iteration may not affect the final calculation result. The polar decoder may omit or skip operations determined not to affect the final calculation result when performing the decoding operation algorithm.

According to exemplary embodiments of a polar code-based decoding method and apparatus in a communication system, decoding operations based on the polar code scheme can be efficiently performed at a receiving node receiving signals encoded and transmitted by a transmitting node based on the polar code scheme. A polar decoder of the receiving node may operate to terminate an iterative loop decoding operation in a specific iteration, when it is determined that subsequent operations thereafter will not affect a final calculation result. As such, by early terminating or breaking the iterative loop decoding operation, the unnecessary amount of computations that do not affect the final calculation result can be skipped. Accordingly, the complexity or amount of calculations of the decoding operations can be reduced, and efficiency can be improved.

However, the effects that can be achieved by the polar code-based decoding method and apparatus in a communication system according to the exemplary embodiments of the present disclosure are not limited to those mentioned above, and other effects not mentioned may be clearly understood by those of ordinary skill in the art to which the present disclosure belongs from the configurations described in the present disclosure.

The exemplary embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the exemplary embodiments of the present disclosure and their advantages have been described in detail, it should be understood that various changes, substitutions and alterations may be made herein without departing from the scope of the present disclosure.

What is claimed is:

1. An operation method of a receiving node in a communication system, the operation method comprising:
    inputting a plurality of reception bits obtained by demodulating a reception signal received from a transmitting node to a plurality of input nodes of a polar decoder of the receiving node;
    performing a decoding operation for calculating first and second output transform values corresponding to first and second unit output nodes in each of a plurality of operation units constituting the polar decoder, based on first and second input transform values corresponding to first and second unit input nodes; and
    obtaining output bits at a plurality of output nodes of the polar decoder based on the decoding operation in each of the plurality of operation units,
    wherein the performing of the decoding operation comprises:
    setting initial values of first and second variables for calculating the first output transform value;
    performing an iterative loop operation including a plurality of iterations for updating the first and second variables; and
    calculating the first output transform value based on values of the first and second variables updated until a time when the iterative loop operation is terminated,
    wherein the iterative loop operation is terminated without performing iterations in which the first and second variables are determined not to be updated among the plurality of iterations.

2. The operation method according to claim 1, wherein the performing of the decoding operation further comprises:
    calculating a minimum value that the first input transform value can have, based on information on a Galois field shared between the transmitting node and the receiving node before setting the initial values of the first and second variables; and sorting values that the second input transform value can have in the plurality of iterations in an ascending order.

3. The operation method according to claim 1, wherein the performing of the iterative loop operation comprises:

comparing a value of a first function defined based on the first and second input transform values with a value of the first variable in a k-th iteration among the plurality of iterations;

updating the value of the second variable based on the value of the first variable when the value of the first variable is greater than or equal to the value of the first function; and updating the value of the first variable based on the value of the first function, wherein k has an integer value greater than or equal to 0 and less than or equal to a first setting value.

4. The operation method according to claim 1, wherein the performing of the iterative loop operation comprises:

comparing a value of a second function defined based on the first and second input transform values with a value of the first variable in a k-th iteration among the plurality of iterations; and terminating the iterative loop operation when the value of the first variable is less than or equal to the value of the second function, wherein k has an integer value greater than or equal to 0 and less than or equal to a first setting value.

5. The operation method according to claim 1, wherein the performing of the decoding operation further comprises calculating the second output transform value based on a sum of the first and second input transform values.

6. The operation method according to claim 1, wherein the obtaining of the output bits comprises performing a successive cancellation (SC) decoding operation in the polar decoder based on the decoding operation in each of the plurality of operation units, and the output bits include a result of restoring transmission bits to be transmitted from the transmitting node to the receiving node, and a result of restoring frozen bits used in a polar code encoding operation for the transmission bits in the transmitting node.

7. A receiving node in a communication system, the receiving node comprising:

a processor;

a memory electronically communicating with the processor; and instructions stored in the memory, wherein when executed by the processor, the instructions cause the receiving node to:

input a plurality of reception bits obtained by demodulating a reception signal received from a transmitting node to a plurality of input nodes of a polar decoder of the receiving node;

perform a decoding operation for calculating first and second output transform values corresponding to first and second unit output nodes in each of a plurality of operation units constituting the polar decoder, based on first and second input transform values corresponding to first and second unit input nodes; and obtain output bits at a plurality of output nodes of the polar decoder based on the decoding operation in each of the plurality of operation units, wherein in the performing of the decoding operation, the instructions further cause the receiving node to:

set initial values of first and second variables for calculating the first output transform value;

perform an iterative loop operation including a plurality of iterations for updating the first and second variables; and calculate the first output transform value based on values of the first and second variables updated until a time when the iterative loop operation is terminated, wherein the iterative loop operation is terminated without performing iterations in which the first and second variables are determined not to be updated among the plurality of iterations.

8. The receiving node according to claim 7, wherein in the performing of the decoding operation, the instructions further cause the receiving node to:

calculate a minimum value that the first input transform value can have, based on information on a Galois field shared between the transmitting node and the receiving node before setting the initial values of the first and second variables; and sort values that the second input transform value can have in the plurality of iterations in an ascending order.

9. The receiving node according to claim 7, wherein in the performing of the iterative loop operation, the instructions further cause the receiving node to:

compare a value of a first function defined based on the first and second input transform values with a value of the first variable in a k-th iteration among the plurality of iterations;

update the value of the second variable based on the value of the first variable when the value of the first variable is greater than or equal to the value of the first function; and update the value of the first variable based on the value of the first function, wherein k has an integer value greater than or equal to 0 and less than or equal to a first setting value.

10. The receiving node according to claim 7, wherein in the performing of the iterative loop operation, the instructions further cause the receiving node to:

compare a value of a second function defined based on the first and second input transform values with a value of the first variable in a k-th iteration among the plurality of iterations; and terminate the iterative loop operation when the value of the first variable is less than or equal to the value of the second function, wherein k has an integer value greater than or equal to 0 and less than or equal to a first setting value.

11. The receiving node according to claim 7, wherein in the performing of the decoding operation, the instructions further cause the receiving node to calculate the second output transform value based on a sum of the first and second input transform values.

* * * * *